US006269130B1

(12) United States Patent
Hansquine

(10) Patent No.: US 6,269,130 B1
(45) Date of Patent: Jul. 31, 2001

(54) CACHED CHAINBACK RAM FOR SERIAL VITERBI DECODER

(75) Inventor: David Hansquine, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/129,022

(22) Filed: Aug. 4, 1998

(51) Int. Cl.$^7$ ............................... H03D 1/00; H04L 27/06
(52) U.S. Cl. ........................ 375/341; 375/262; 714/794; 714/795
(58) Field of Search ................................. 375/262, 341; 714/795, 794, 786, 796

(56) References Cited

U.S. PATENT DOCUMENTS

| | | | |
|---|---|---|---|
| 5,408,502 | * 4/1995 | How | 375/340 |
| 5,710,784 | * 1/1998 | Kindred et al. | |
| 6,005,898 | * 12/1999 | Kaewell, Jr. | 375/341 |
| 6,038,269 | * 12/1999 | Raghavan | 375/340 |
| 6,094,465 | * 7/2000 | Stein et al. | 375/346 |

OTHER PUBLICATIONS

A. Stolzle et al.: "Integrated Circuits for a Real–Time Large Vocabulary Continuous Speech Recognition System"; IEEE Journal of Solid–State Circuits, vol. 26, No. 1, Jan. 1991, pp. 2–11.
PJ Black, et al: "A 1–GB/S, Four–State, Sliding Block Viterbi Decoder"; IEEE Journal of Solid–State Circuits, US, IEEE Inc. New York, vol. 32, No. 6, pp. 797–805.

* cited by examiner

*Primary Examiner*—Chi Pham
*Assistant Examiner*—Jean B Corrielus
(74) *Attorney, Agent, or Firm*—Philip Wadsworth; Charles D. Brown; Bruce W. Greenhaus

(57) ABSTRACT

A serial Viterbi decoder having a chainback cache is provided for use in a mobile telephone. In one embodiment described herein, the decoder includes a branch error metric block, an add-compare-select unit, and a chainback block including a chainback RAM, a full chainback cache and chainback controller circuitry. The chainback cache caches decision bits from previous process cycles such that full chainback operations need not always be performed. The chainback cache is configured to cache on all reads. With the chainback cache, significant savings in power consumption and processing time may be achieved with only a relatively modest increase in the amount of circuitry required. In another embodiment, a full chainback cache is not provided. Rather, the chainback block instead includes an L+1 bit RAM, an updown counter and a shift register configured to emulate a chainback cache. In still another embodiment, an L bit shift register is employed instead of the combination of the L+1 bit RAM and updown counter. In the various embodiments, the chainback block may be configured to perform only one chainback read in each process cycle or may be configured to perform m chainback reads in each process cycle. In still other embodiments, the chainback block is configured to perform chainback operations based on a through b reads where the cache is accessed for each read after a reads have been done until b reads have been performed or a match is obtained. In still further embodiments, the chainback block is configured to perform chainback operations over multiple process cycles rather than only a single process cycle.

13 Claims, 9 Drawing Sheets

CACHED CHAINBACK RAM FOR SERIAL VITERBI DECODER

BACKGROUND OF THE INVENTION

I. Field of the Invention

The invention generally relates to serial Viterbi decoders and in particular to serial Viterbi decoders for use within Code Division Multiple Access (CDMA) wireless communication systems.

II. Description of the Related Art

FIG. 1 is an illustrative block diagram of a variable rate CDMA transmission system 10 described in the Telecommunications Industry Association's Interim Standard *TIA/EIA/IS-95-A Mobile Station-Base Station Compatibility Standard for Dual-Mode Wideband Spread Spectrum Cellular System*. This transmission system may be provided, for example, within a base station of a cellular transmission system for use in transmitting signals to mobile telephones within a cell surrounding the base station.

An input line 11 provides a speech or data signal which may be analog or digital. In the following example, it will be assumed that the input signal is a speech signal. The input line may be an analog or digital public switched telephone network (PSTN) line or other speech signal source. If the input speech signal is analog, the signal is sampled and digitized by an analog to digital converter (not shown). A variable rate data source 12 receives the digitized samples of the speech signal and encodes the signal to provide packets of encoded speech of equal frame lengths. Variable rate data source 12 may, for example, convert the digitized samples of the input speech to digitized speech parameters representative of the input voice signal using Linear Predictive Coding (LPC) techniques. In one embodiment, the variable rate data source is a variable rate vocoder as described in detail in U.S. Pat. No. 5,414,796. Variable rate data source 12 provides variable rate packets of data at four possible frame rates 9600 bps, 4800 bps, 2400 bps and 1200 bps, referred to herein as full, half, quarter, and eighth rates. Packets encoded at full rate contain 172 information bits, samples encoded at half rate contain 80 information bits, samples encoded at quarter rate contain 40 information bits and samples encoded at eighth rate contain 16 information bits. The packets regardless of size all are one frame length in duration, i.e. 20 ms. Other systems may employ other data rates or packet sizes. Herein, the terms "frame" and "packet" may be used interchangeably.

The packets are encoded and transmitted at different rates to compress the data contained therein based, in part, on the complexity or amount of information represented by the frame. For example, if the input voice signal includes little or no variation, perhaps because the speaker is not speaking, the information bits of the corresponding packet may be compressed and encoded at eighth rate. This compression results in a loss of resolution of the corresponding portion of the voice signal but, given that the corresponding portion of the voice signal contains little or no information, the reduction in signal resolution is not typically noticeable. Alternatively, if the corresponding input voice signal of the packet includes much information, perhaps because the speaker is actively vocalizing, the packet is encoded at full rate and the information bits of the packet are not compressed at all.

This compression and encoding technique is employed to limit, on the average, the amount of signals being transmitted at any one time to thereby allow the overall bandwidth of the transmission system to be utilized more effectively to allow, for example, a greater number of telephone calls to be processed at any one time.

The variable rate packets generated by data source 12 are provided to packetizer 13 which selectively appends cyclic redundancy check (CRC) bits and tail bits. The variable rate packets from packetizer 13 are then provided to encoder 14 which encodes the bits of the variable rate packets for error detection and correction purposes. In one embodiment, encoder 14 is a rate ⅓ convolutional serial Viterbi encoder. The convolutionally encoded symbols are then provided to a modulator 16 which generates a modulated signal. An implementation of a CDMA modulator is described in detail in U.S. Pat. Nos. 5,103,459 and 4,901,307. The modulated signal is then provided to digital to analog converter 22 for conversion to an analog signal, then provided to transmitter 24 which upconverts and amplifies the signal for transmission through antenna 26.

FIG. 2 illustrates pertinent components of a mobile telephone 28 or other mobile station receiving the transmitted signal. The signal is received by antenna 30, downconverted and amplified, if necessary, by receiver 31 and demodulated by a demodulator 32 into a stream of symbols which remain convolutionally encoded. The signal is then provided to a serial Viterbi decoder 34 which decodes a convolutionally encoded stream of symbols. The decoder also subdivides the received signal into packets and determines the corresponding frame rate for each packet. The frame rate may be determined, for example, by detecting the duration of individual bits of the frame. Aspects of an exemplary serial Viterbi decoder are described in now abandoned U.S. patent application Ser. No. 08/126,477 filed Sep. 24, 1993, assigned to the assignee of the present invention and incorporated by reference herein.

To decode the stream of symbols, decoder 34 employs a branch error metric block 36 which receives symbols from the demodulator and an Add Compare Select block (ACS) 38 which produces decision bits based upon the symbols. To enhance performance, the decoder chains back from what it considers the best state metric using a chainback block 40 which processes the decision bits received from ACS 38. In each process cycle, $2^{K-1}$ decision bits are stored by the chainback block in a chainback RAM 41 wherein K is the constraint length of the code employed by the encoder. The state with the lowest best state metric is passed from the ACS to the chainback block as the best state.

Once L process cycles have elapsed, chaining back begins. The chainback operation is controlled by a chainback controller 42. The process of chaining back is performed by reading from the chainback RAM the decision bit for the best state for the previous process cycle (L−1). The read decision bit is shifted into the least significant bit of best state. The chainback block next reads from the chainback RAM the decision bit corresponding to the new value of best state for process cycle L−2. This process is performed a total of L times ultimately reading the decision bit of the calculated best state for process cycle 0. The final decision bit is the decoded information bit. Each bit that is read modifies the address of the subsequent read. In the next process cycle, L+1, the whole procedure is repeated again, reading state decision bits from process cycles L down to 1. This continues for as many process cycles as necessary to retrieve the required number of information bits for the particular system.

Specific examples of chainback operations are illustrated in FIG. 3. If the first chainback occurs after 4 process cycles and the best state is 101 after four process cycles, then the reads performed to complete the chainback process are those shown by entries shaded in gray. First state 101 of process cycle 3 will be read, then state 011 of process cycle 2, then state 111 of process cycle 1, then state 110 of process cycle 0, resulting in an output decision bit of 0. At the beginning of process cycle 5, if the best state is 010, then the first read results in the best state being set to 101. Hence, the next three reads will follow the same path as before, namely the path of entries shaded in gray. This time though the output decision bit is read from the process cycle 1 entry thereby resulting in a decision bit of 0. At the beginning of process cycle 6, if the best state is 001, then the first read results in the best state being set to 010. Hence, the next three reads will again follow the same path as before. This time the output decision bit is read from the process cycle 2 entry thereby resulting in a decision bit of 1.

Referring back to FIG. 2, ultimately, decoder 34 provides a decoded packet along with a signal identifying a detected frame rate for the packet. Both are forwarded to a frame quality check unit 43 which attempts to verify that no transmission errors or frame rate detection errors occurred. In the exemplary embodiment, frame quality check unit 43 performs a CRC, a symbol error rate check and a Yamamoto metric check. To perform the symbol error rate check, frame quality check unit 43 re-encodes symbols found in the decoded packet and compares the re-encoded symbols with symbols input to the frame quality check unit to detect any differences. To perform the Yamamoto metric check, frame quality check unit 43 applies the received frames to a trellis path decoder and determines whether a resulting metric is acceptable. Acceptable frames are routed to a speech decoder 44 for conversion back to digitized voice signals. The digitized voice signals are converted to analog signals by a digital to analog converter (not shown) for ultimate output through a speaker 46 of the mobile telephone such that an operator of the telephone can hear the speech signal that had been originally input to the overall system along line 11 of FIG. 1.

Although not shown, the mobile telephone of FIG. 2 may have additional components for inputting an analog speech signal from the operator of the mobile telephone and for processing and transmitting the signal using CDMA techniques. The additional components of the mobile telephone may be similar to the components shown in FIG. 1. Moreover, although not shown, the transmission system of FIG. 1 may have additional components provided for receiving the transmitted signal from the mobile telephone and for processing and outputting the signal as an analog or digital speech signal, perhaps onto a PSTN line. The additional components of the system of FIG. 1 may be similar to the components shown in FIG. 2.

Thus an important component of the overall system is the serial Viterbi decoder provided for decoding the transmitted symbols. As noted, decoder 34 exploits a chainback operation to enhance performance. To gain a significant enhancement in performance the length of the chainback is preferably at least 3 to 5 times the constraint length of the encoder (K=9 for CDMA) with better performance with larger chainback depth. However, the larger the length of the chainback, the greater amount of circuit area and power required to implement the chainback. Larger circuit area is required because a larger memory is required to store the decision bits of the chainback. For example, for a constraint K encoder, $2^{K-1}$ decision bits are stored for each information bit. With a chainback depth of L, $L*2^{K-1}$ bits need to be stored. Greater power is required because, in order to generate one bit of data, the chainback block needs to perform L reads.

Also, a greater delay occurs before the chainback operation is completed. Although described with respect to a CDMA system employing a serial Viterbi decoder, similar problems can occur in most systems employing serial Viterbi decoders and in related decoder systems as well.

Accordingly, it would be desirable to provide a technique for substantially reducing the power usage and processing time of the chainback block while only requiring a small increase in area and it is to that end that aspects of the present invention are primarily drawn.

SUMMARY OF THE INVENTION

In accordance with one aspect of the invention, an improvement is provided within a serial Viterbi decoder for decoding a convolutionally encoded stream of symbols using a chainback memory which stores a plurality of decision bits for each of a plurality of process cycles. The improvement comprises a chainback cache, connected to the chainback memory, for storing a sequence of decision bits determined by a previous process cycle.

In one exemplary embodiment, the serial Viterbi decoder includes a branch error metric block, an ACS, and a chainback block including a chainback RAM, a full chainback cache and chainback controller circuitry. The chainback cache is configured to cache on all reads. In another exemplary embodiment, a full chainback cache is not provided. Rather, the chainback block instead includes an L+1 bit RAM, an updown counter and a shift register configured to emulate a chainback cache. In still another exemplary embodiment, an L bit shift register is employed instead of the combination of the L+1 bit RAM and updown counter. In the various embodiments, the chainback block may be configured to perform only one chainback read in each process cycle or may be configured to perform m chainback reads in each process cycle before attempting to use the cache. In still other embodiments, the chainback block is configured to perform a through b reads during each chainback operation, wherein after a reads, the cache is checked for each subsequent read until b reads have been performed or until a match is obtained. In still further embodiments, the chainback block is configured to perform chainback operations over multiple process cycles rather than only a single process cycle. Combinations of features of these embodiments may be appropriate as well.

In the various exemplary implementations, by providing circuitry for caching decision bits from previous process cycles, significant savings in power consumption and processing time are typically achieved, with only a relatively modest increase in the amount of circuitry required.

Method and apparatus embodiments of the invention are described.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

With reference to the remaining figures, preferred and exemplary embodiments of the invention will now be described.

Figure 2:
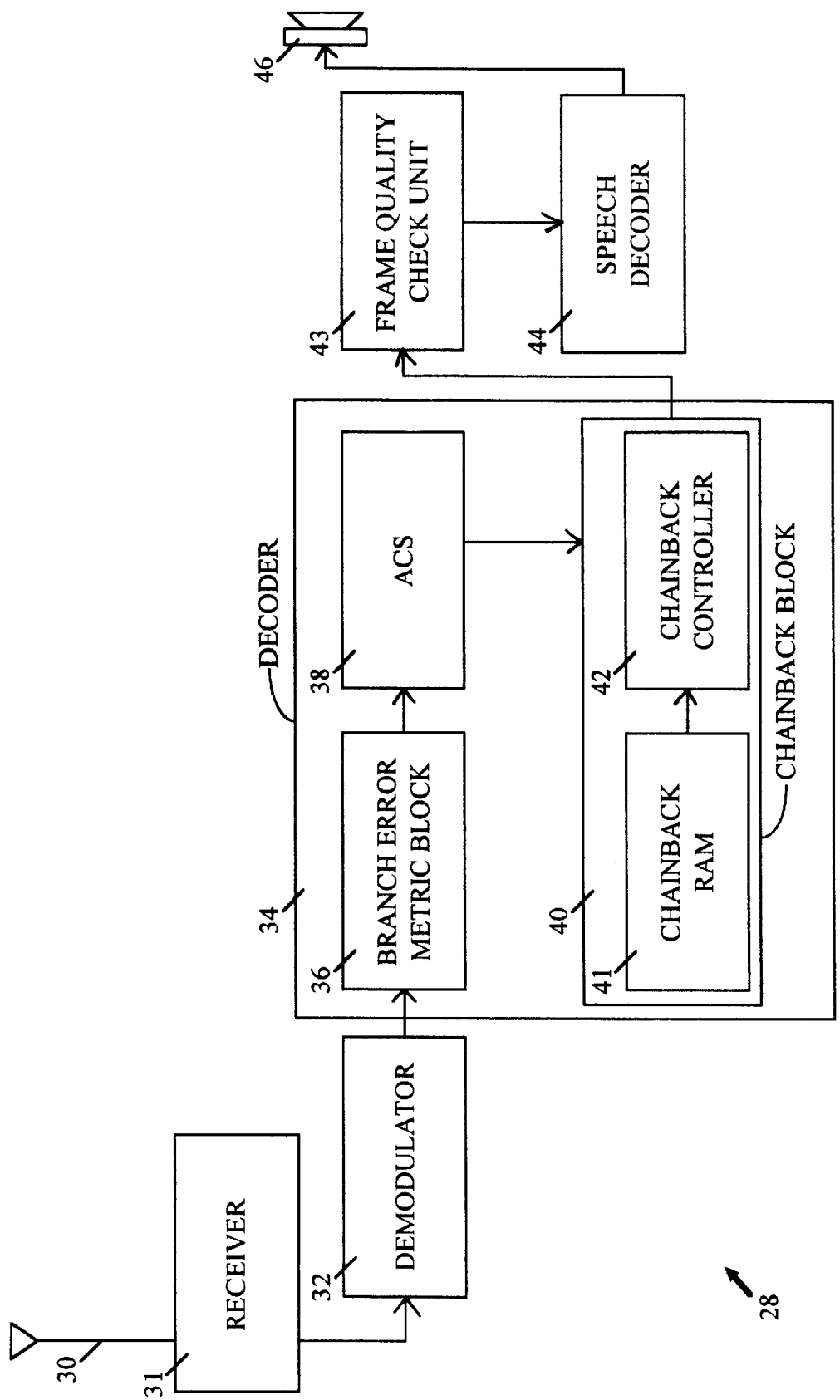
FIG. 2 is an block diagram illustrating pertinent components of a mobile telephone or other mobile station receiving the signal transmitted by the CDMA transmission system of FIG. 1 and decoding the signal using a serial Viterbi decoder with a chainback block.
Figure 3:
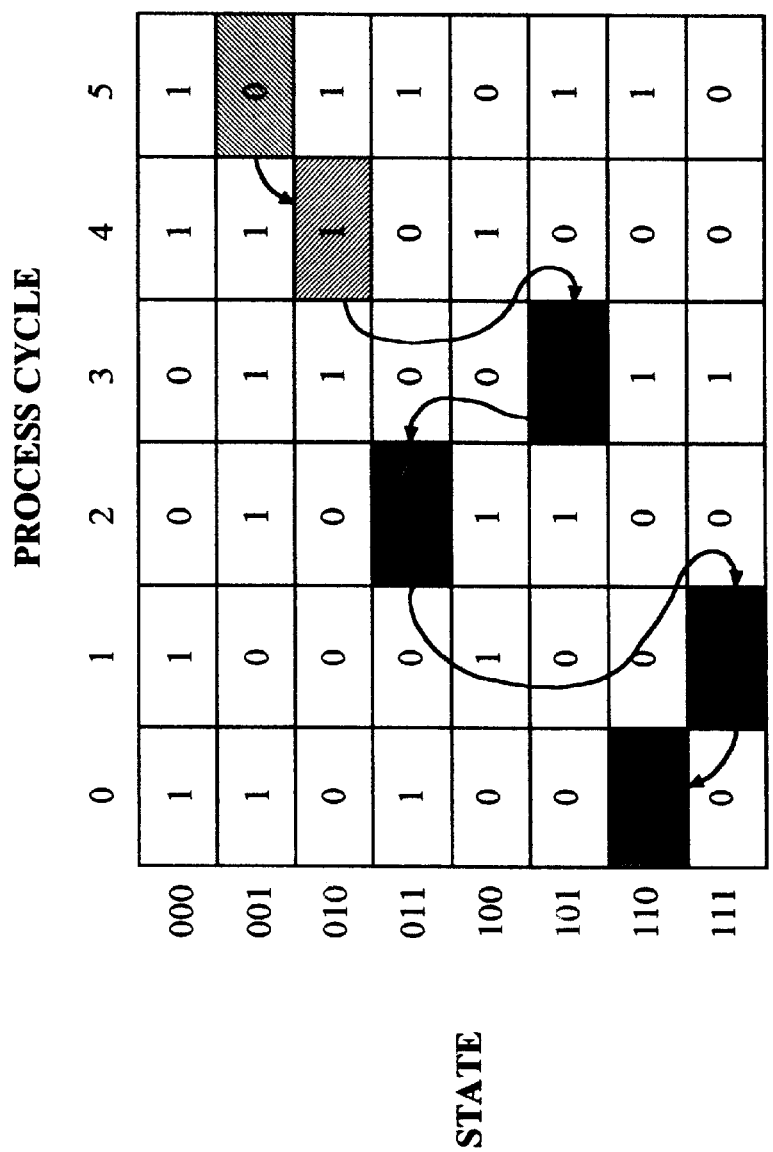
FIG. 3 is an diagram illustrating a chainback operation performed by a chainback block of the mobile telephone of FIG. 2.
Figure 4:
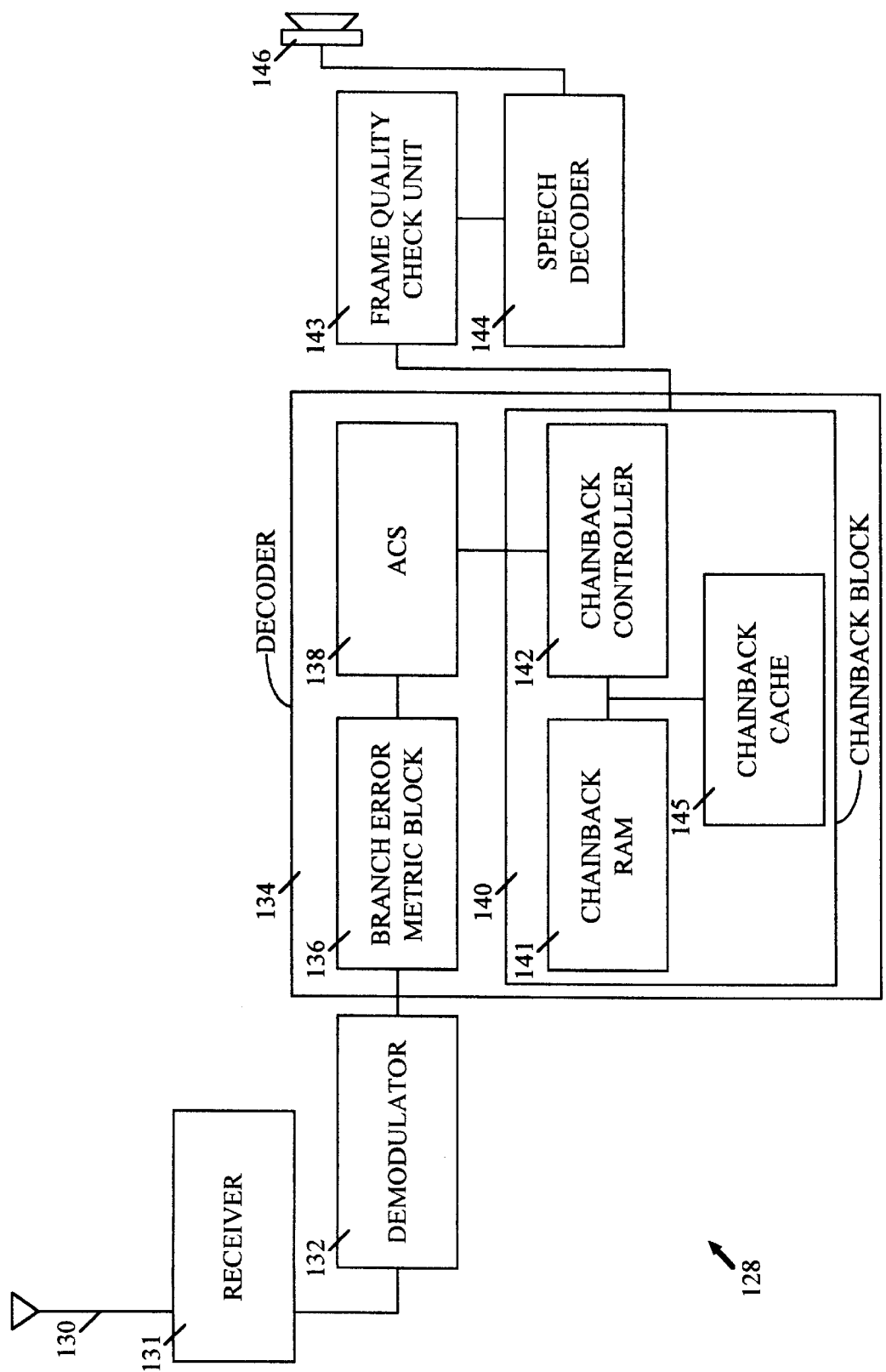
FIG. 4 is an block diagram illustrating, at a high level, pertinent components of a mobile telephone or other mobile station configured in accordance with an exemplary embodiment of the invention wherein a serial Viterbi decoder having a chainback block with chainback cache is provided.

FIG. 4 illustrates pertinent components of a mobile telephone 128 or other mobile station receiving a transmitted CDMA signal. Portions of mobile telephone 128 operate in the same manner as the mobile telephone of FIG. 2 and will be only briefly described. The CDMA signal is received by antenna 130, downconverted and amplified, if necessary, by receiver 131 and demodulated by a demodulator 132 into a stream of convolutionally encoded symbols. The convolutionally encoded symbols are then provided to a modified serial Viterbi decoder 134 which decodes the stream of symbols using a branch error metric block 136, an ACS 138, and a chainback block 140. The chainback block includes a chainback RAM 141, a chainback controller 142 and a chainback cache 145 configured to only cache on reads. The state with the lowest best state metric is passed from the ACS to the chainback block as the best state where it is stored in the chainback RAM and is also stored in the chainback cache so that it can be easily re-accessed. As will be described below, the decoder need not actually include a full separate cache memory as shown in FIG. 4. However, for clarity in describing the overall operation of the cached-chainback system, it is first assumed that a full cache memory is employed.

With the cached-chainback system of FIG. 4, the chainback operation is performed by reading from chainback cache 145 the decision bit representative of the beststate metric if the current beststate metric calculated after one read in the new process cycle matches the starting beststate metric of the last process cycle. If the newly calculated beststate metric does not match, then conventional chainback is performed. More specifically, at the beginning of the process cycle, a signal encstate is set to the beststate metric. A first decision bit is read from the chainback RAM from the location specified by encstate, and the read bit is shifted into the least significant bit of encstate. The new value of encstate is then compared against a value called last_beststate which holds the beststate metric for the previous process cycle. If the values match, it is unnecessary to perform the additional L−1 reads to complete the chainback operation. Rather, the final bit can simply be read from the cache. (The signals last_beststate and encstate are not specifically shown in FIG. 4 but are shown in other figures described below.) Assuming that the additional L−1 reads must be performed, the chainback block next reads from the chainback RAM the decision bit corresponding to the value of encstate for decision bits written during process cycle L−2. This process is performed a total of L times ultimately reading the decision bit of the calculated encstate for process cycle 0. The final decision bit is the decoded information bit. Each bit that is read modifies the address of the subsequent read. In the next process cycle, L+1, the procedure is repeated again, reading state decision bits from process cycles L down to 1. This continues for as many process cycles as necessary to retrieve the required number of information bits for the particular system.

Once the conventional chainback operation is completed, the entire sequence of decision bits generated by the conventional chainback operation are stored in chainback cache 145 such that, on the next process cycle, the complete chainback operation may not need to be repeated. More specifically, after a first chainback process cycle has been completed then, in subsequent process cycles, the first read will make encstate assume the value it had at the beginning of the previous process cycle and the value of encstate therefore matches the value of last_beststate. This is not always the case but is true most of the time because of path convergence properties of convolutional codes. Hence, in a given process cycle, it is likely that L−1 reads will be the same as the previous process cycle and the final decision bit will be the second to last bit read during the previous process cycle. Hence, the provision of the chainback cache permits the decision bits for the L−1 reads including the final decision bit to be merely read out from the cache, rather than recalculated, thereby enhancing performance.

Figure 1:
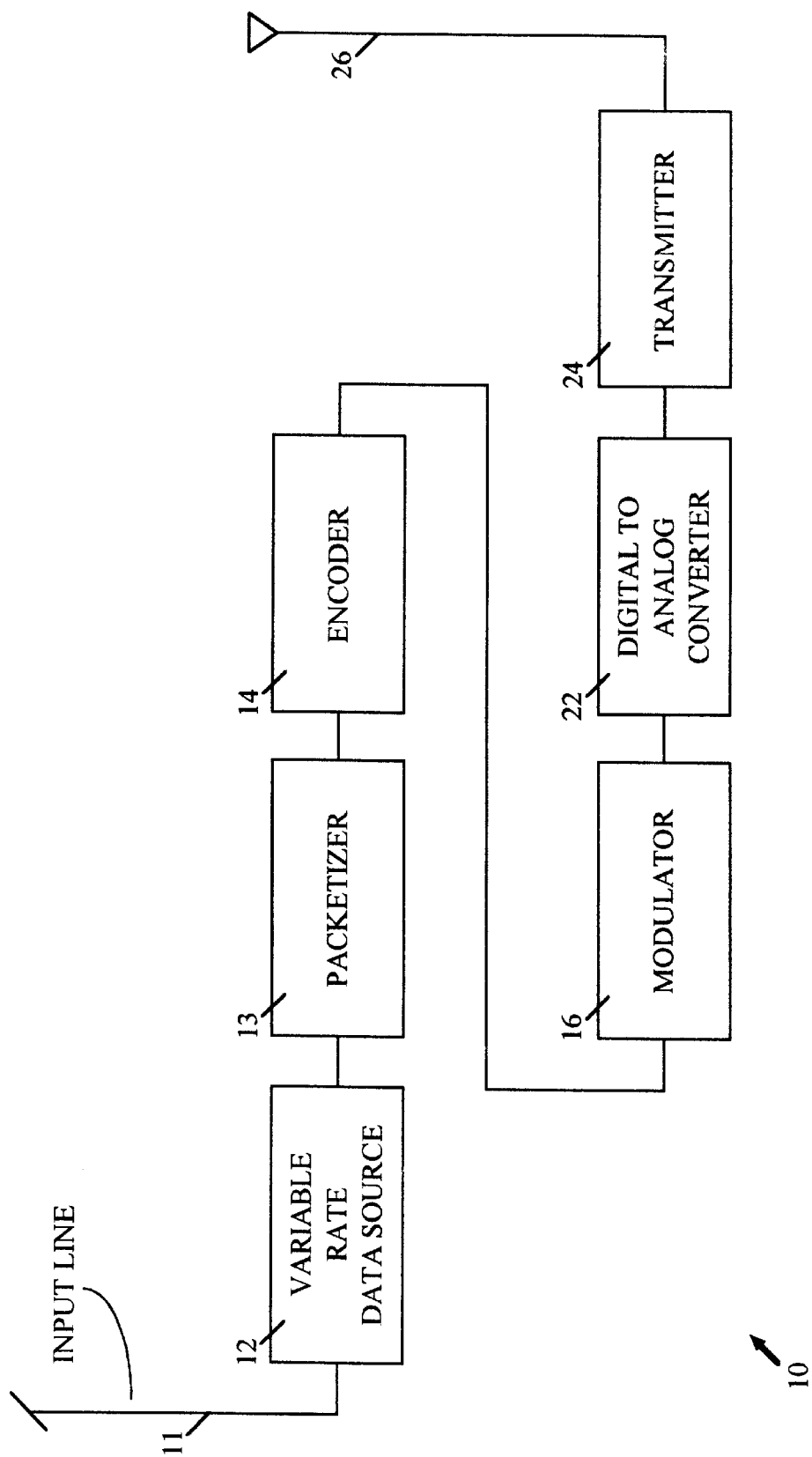
FIG. 1 is an block diagram illustrating pertinent components of a variable rate CDMA transmission system.

Ultimately, decoder 134 provides a decoded packet along with a signal identifying a detected frame rate for the packet a frame quality check unit 143 which attempts to verify that no transmission errors or frame rate detection errors occurred using a CRC, a symbol error rate check and a Yamamoto metric check. Acceptable frames are routed to a speech decoder 144 for conversion back to digitized voice signals. The digitized voice signals are converted to analog signals by a digital to analog converter (not shown) for ultimate output through a speaker 146 of the mobile telephone. Although not shown, the mobile telephone of FIG. 4 may have additional components for inputting an analog speech signal from the operator of the mobile telephone and for processing and transmitting the signal using CDMA techniques. The additional components of the mobile telephone may be similar to the components shown in FIG. 1.

Thus, FIG. 4 illustrates, at a high level, a mobile telephone employing a serial Viterbi decoder having a chainback block with a full separate chainback cache configured to cache on reads. The logic of the cache memory inherently operates to maintain a copy of the various read decision bits in its own memory. Overall power savings are achieved so long as the power requirements of the cache memory are no greater than the power reduction gained by not having to access the chainback RAM as often. Also, overall decode time may be reduced, depending upon the implementation, over implementations without a chainback cache. Decode time savings may be achieved as a result of the system performing only one cache read when a match occurs, rather than performing L−1 additional reads from the chainback RAM if no match occurred. The reduction in decode time is particularly significant in systems wherein the chainback RAM is slow and the cache is fast.

An exemplary comparison between a non-cached chainback block and a cached chainback block performance is as follows. For an IS95 rateset 1 channel having a frame error rate of 1%, a non-cached serial Viterbi decoder might perform 289 chainback operations with L=63. Note that the last 72 bits of a packet are obtained through a single chainback operation. The total number of chainback RAM reads is therefore 289*63=18207. Out of 100 frames of data, encstate after one read matches previous process cycle's beststate an average of about 233 times per frame (out of the 289 chainback operations). Thus, the total number of chainback RAM reads required using the cached chainback block is only 56*63+233=3761 thereby representing an average savings per frame of 14446 reads. For an IS95A rateset 2 channel having a frame error rate of 1%, a non-cached serial Viterbi decoder might perform 437 chainback operations with L=95. Note that the last 104 bits of a packet are obtained through a single chainback operation. Thus, the total number of chainback RAM reads is therefore 437*95= 41515. Out of 23 frames of data, beststate after one read matches previous process cycle's beststate an average of about 338 times per frame (out of the 437 chainback operations). Thus, the total number of chainback RAM reads required using the cached chainback block is only 99*95+ 338=9743 thereby representing an average savings per frame of 31772 reads. Actual results may differ depending upon the particular system.

The chainback block of FIG. 4 may be implemented using any of variety of other specific configurations as well configured to provide a further reduction in power usage or a reduction in circuit area or both. Some specific exemplary configurations will now be described with reference to the remaining figures.

Figure 5A:
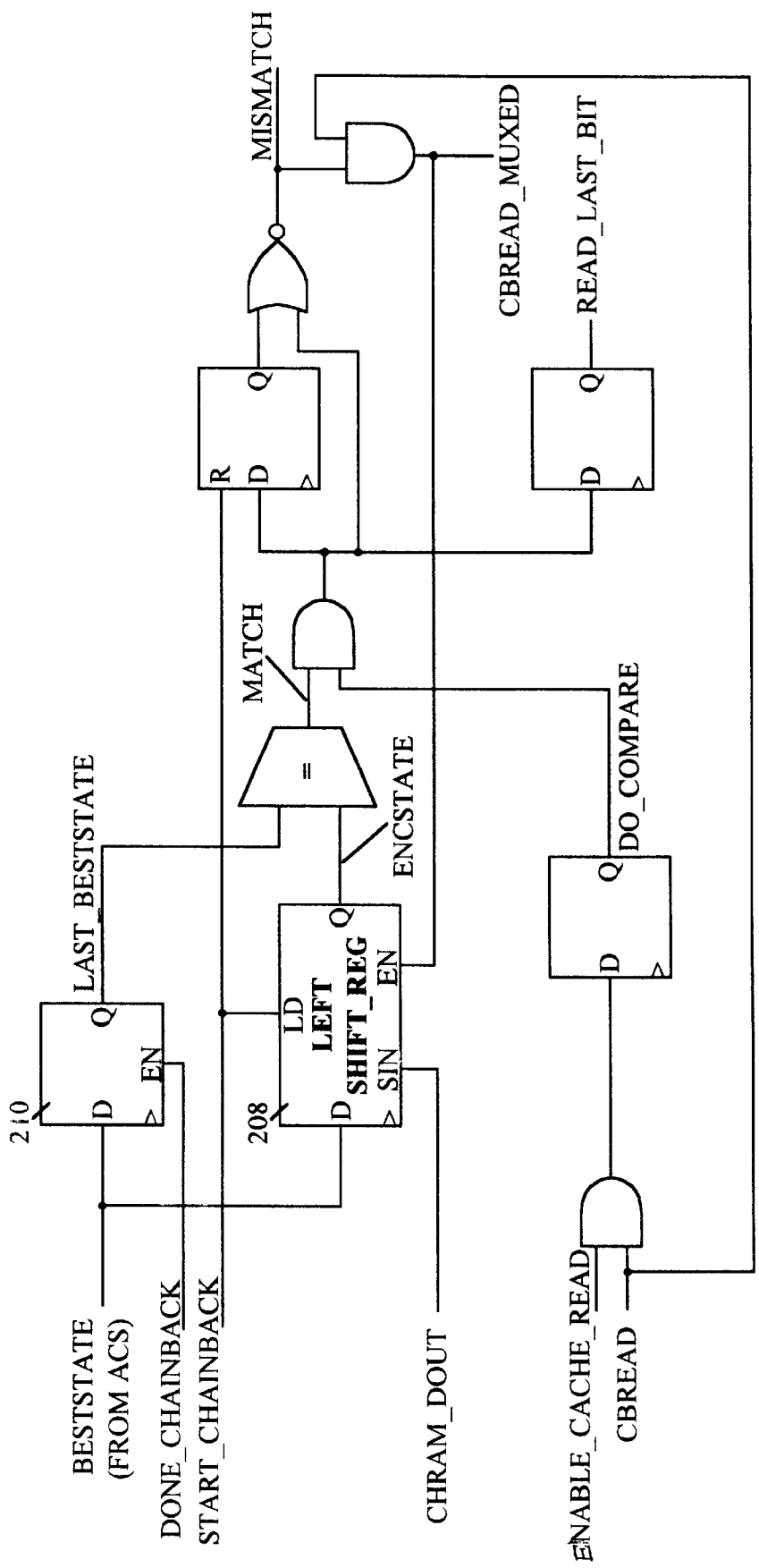
FIGS. 5A and 5B illustrate in detail a first embodiment of a chainback block of the mobile telephone of FIG. 4.
Figure 5B:
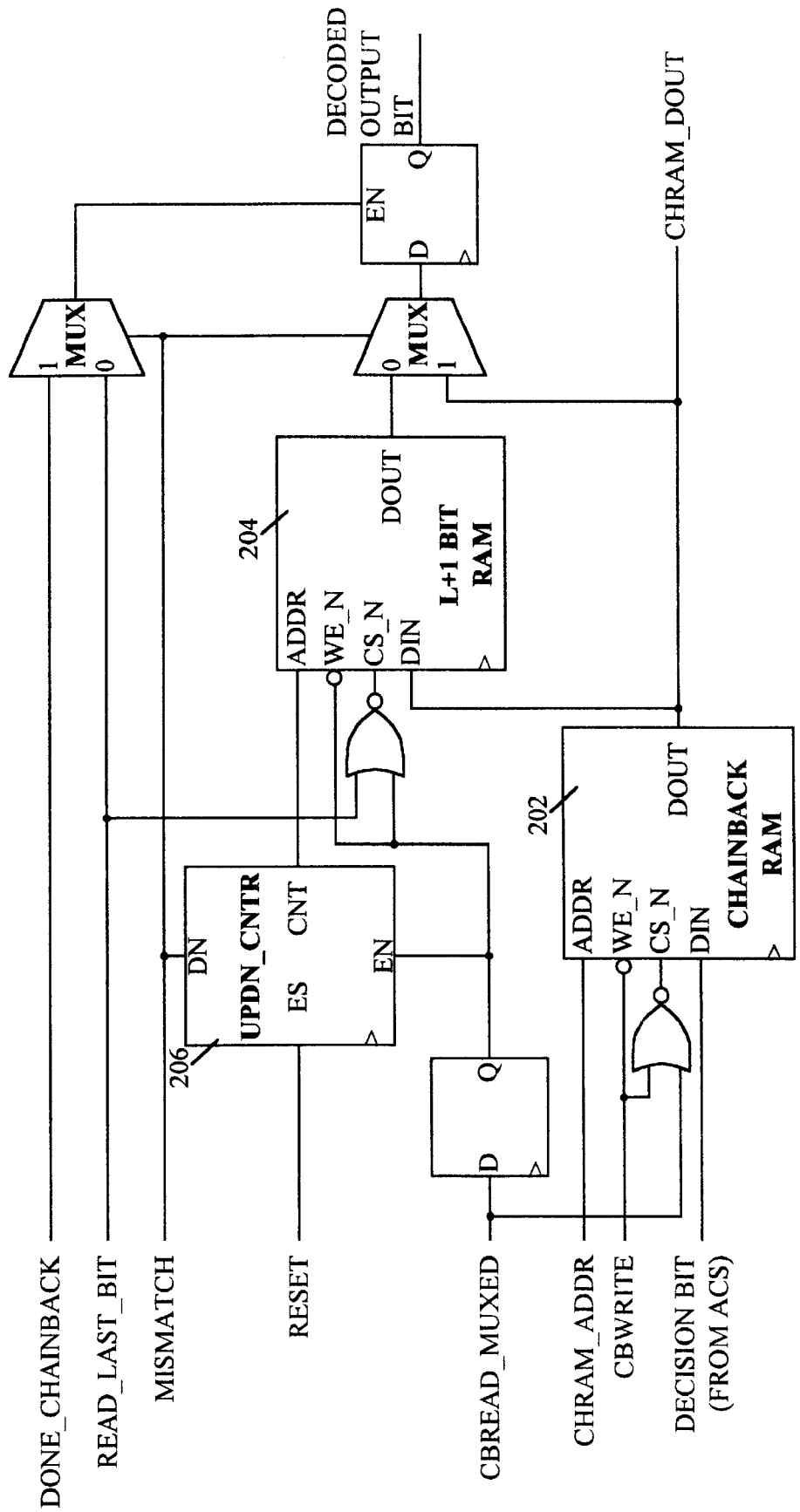

FIGS. 5A and 5B illustrate a more efficient implementation of the chainback block that can further reduce read accesses to the chainback RAM by employing a small L+1 bit RAM or register file to store the decision bits read each process cycle. The chainback block includes a chainback RAM 202, an L+1 bit RAM 204, an updown counter 206 and a shift register 208 interconnected along with various registers and logic gates as shown. After L process cycles, the first chainback operation commences. The best state for the previous process cycle (beststate) is stored in shift register 208, the output of which is the value referred to above as encstate. The L bits read from chainback RAM 202 are stored in L+1 bit RAM 204 (with an extra bit stored to make the circuitry simpler than if only L bits were stored). A separate register 210 is used to keep track of the previous beststate value which referred to above as last_beststate. In the next process cycle, the new value of beststate is latched in shift register 208. The first read of a process cycle results in a decision bit which is shifted into the lowest bit of shift register 208. This bit is also stored in L+1 bit RAM 204 as before. If encstate now matches last_bestate, then the bit from the smallest/oldest process cycle is removed from L+1 bit RAM 204 thereby becoming the output bit. This bit is the same bit that would have resulted from having performed a complete chainback operation on the chainback RAM; it is simply obtained with less processing time and effort. If, after one read, encstate does not match last_beststate, the full chainback operation is performed, simultaneously filling L−1 locations of the L+1 bit RAM 204. In either case, at the end of the process cycle, the previous value of beststate is stored in last_beststate and subsequent process cycles proceed in the same manner as the process cycle just described. By configuring the chainback block with the L+1 bit RAM, fewer read operations are required by the chainback RAM thereby further reducing power usage of the overall decoder.

The implementation of FIGS. 5A and 5B may appear somewhat complex, but compared with an implementation having a chainback block with a cache accessed each process cycle, the chainback block of FIGS. 5A and 5B only requires the addition of updown counter 206, L+1 bit RAM 204 (or other register file) and the various single bit registers and combinatorial logic as shown. Such has the advantage that on process cycles with a match, only one chainback RAM read needs to be performed rather than L, as well as one L+1 bit RAM read and write which is relatively insignificant. On process cycle mismatches, L chainback RAM reads need to be done as well as L writes to the L+1 bit RAM. These latter writes are not power costly since the memory size is small and since the frequency of mismatches is usually kept small. If a register file is used, these writes may be even less power costly.

The chainback block of FIGS. 5A and 5B operates in response to a number of control signals generated by other circuitry not illustrated in detail. The control signals are as follows:

reset:
General reset signal to reset some of the logic.
beststate:
This signal is obtained from ACS 138 (FIG. 4) and indicates the state with the lowest error metric for the last process cycle. The beststate signal changes before start_chainback pulses and after done_chainback pulses.
decision bit:
Generated in the ACS. This is the data to be stored in the chainback RAM.
start_chainback:
Pulses at the beginning of each process cycle to indicate that a chainback operation may commence.
done_chainback:
Pulses at the end of the process cycle when the chainback operation is complete.
enable_cache_read:
Enables the small L+1 bit RAM or register file to be used to obtain the output bit. The enable_cache_read signal pulses for 1 clock cycle simultaneous with the first cbread pulse of each process cycle.
cbread:
Pulses L times each process cycle to perform L reads from the chainback RAM. The first one occurs after start_chainback and the last occurs before done_chainback. If there is a match, only the first read will be performed, and the remainder will be masked out by the circuit.
cbwrite:
Pulses each time a decision bit is ready to be stored in the chainback RAM.
chram_addr:
The normal address that would be driving the chainback RAM. For additional power savings, these lines can be masked out and held static when the remaining L−1 chainback RAM reads are skipped.
do_compare:
Internal signal indicating that the results of the comparator will be considered, i.e. the chainback block compares the current value of encstate to the last process cycle's beststate, saved as last_beststate, and makes the determination whether a match is made or not.
match:
Internal signal that indicates that the current value of encstate matches last_beststate from the previous process cycle.
mismatch:
Internal signal that indicates that after the first chainback RAM read, encstate did not match last_bestate cbread_muxed:
An internal signal resembling cbread except that it is masked out when a match is made.

read_last_bit:
An internal signal that is used to latch the output bit from the L+1 bit RAM into a register.

chram_dout:
Internal signal that is the read bit from the chainback RAM.

decoded output bit:
The decoded output bit. It is identical to the final bit that would have been produced from performing the full chainback operation each process cycle, although its timing may differ.

Figure 6A:
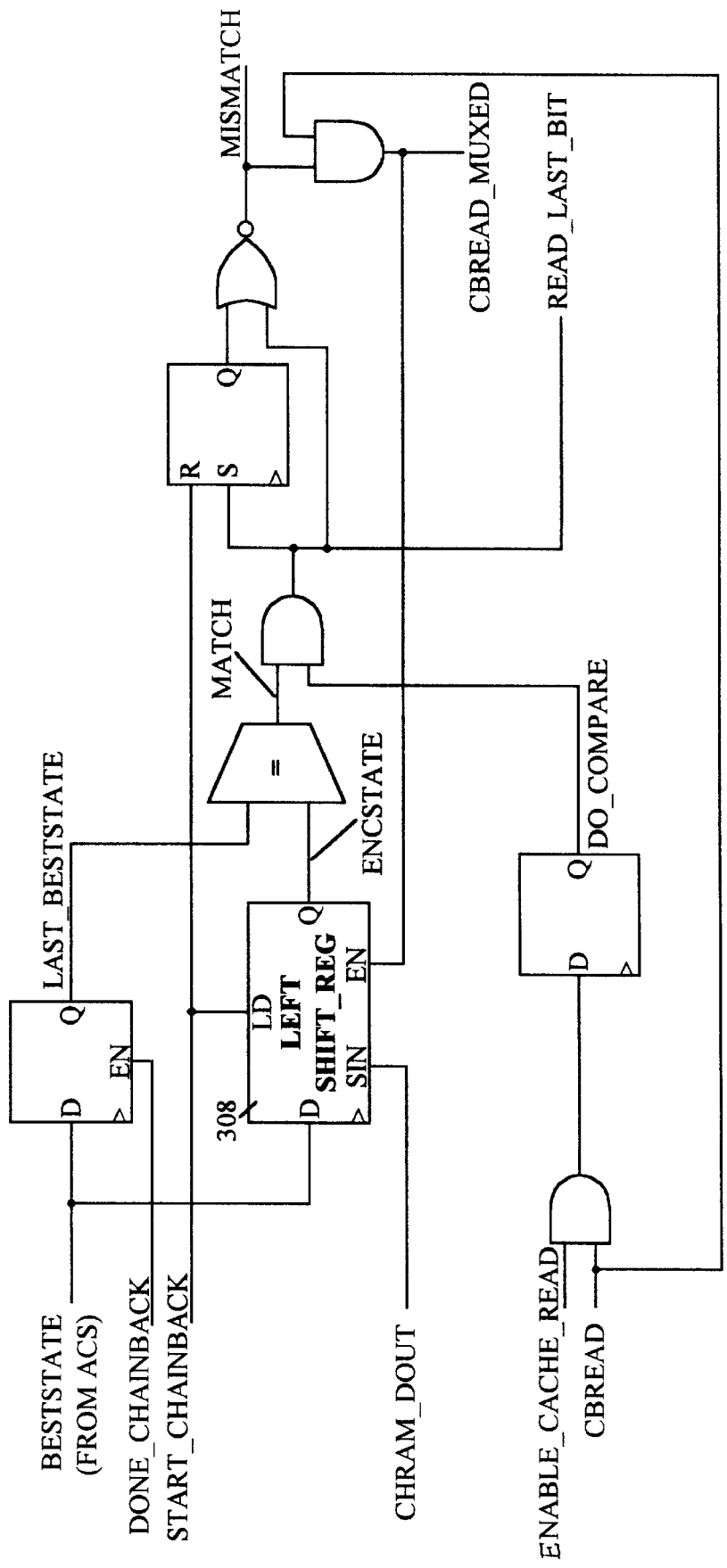
FIGS. 6A and 6B illustrate in detail a second embodiment of a chainback block of the mobile telephone of FIG. 4.
Figure 6B:
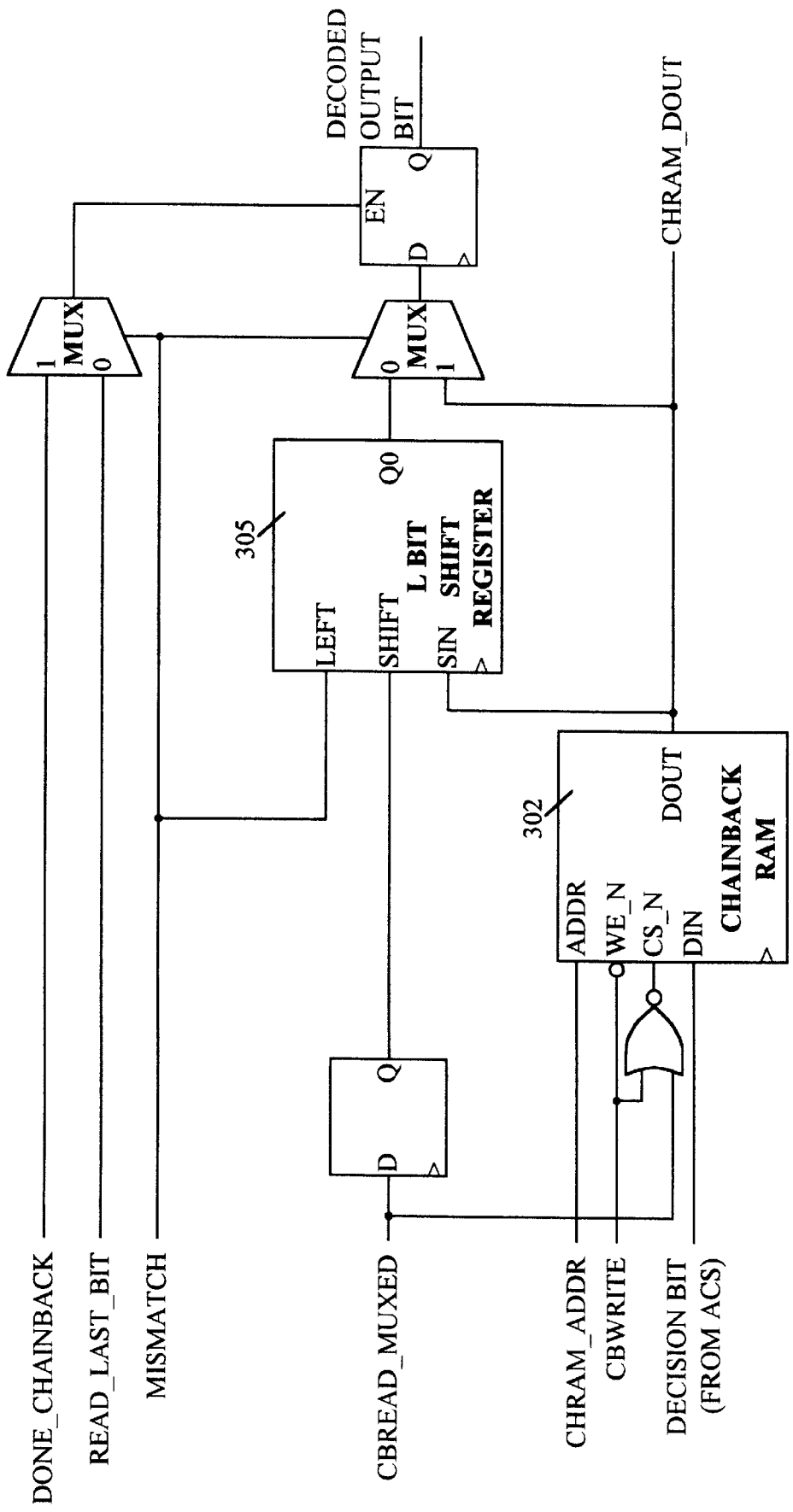

FIGS. 6A and 6B illustrate an implementation similar to that of FIGS. 5A and 5B but wherein a L bit shift register is employed instead of the combination of the L+1 bit RAM and updown counter. More specifically, the chainback block of FIGS. 6A and 6B includes a chainback RAM 302, L bit shift register 305, and a shift register 308 interconnected along with various registers and logic gates as shown. After the first read in a process cycle, the read bit is shifted into shift register 308, the output of which is encstate. If encstate now matches last_bestate, the read bit is shifted into the upper bit of the L bit shift register and the lowest bit of the L bit shift register is the output bit that would result from the chainback operation. If encstate does not match last_beststate, then the read bit is shifted into the lowest bit of the L bit shift register and the remaining L−1 read bits are shifted into the lowest bit as well.

It should be noted that the L bit shift register needs to be able to shift in both directions, i.e. the L bit shift register of FIGS. 6A and 6B differs from a standard shift register in that it includes an additional input left that determines the direction to shift. Also, for each bit read from the chainback RAM, all L bits need to be shifted at once which may increase power consumption over the implementation of FIGS. 5A and 5B. In yet another embodiment (not shown), power usage is further reduced by adding decoding logic to select each bit separately, with each bit of the shift register being separately loadable. Then when L bits are to be stored, storage is accomplished by loading each bit individually. Hence, the register only needs to shift when matches occur (once per process cycle) thereby reducing power consumption. In still other embodiments, circuitry is provided to check for matches after the first two or more reads of a process cycle to further increase the probability of a match thereby further reducing decode time and power usage. Such circuitry may be employed in the embodiments of FIGS. 5A and 5B or FIGS. 6A and 6B and in other embodiments as well.

Figure 7:
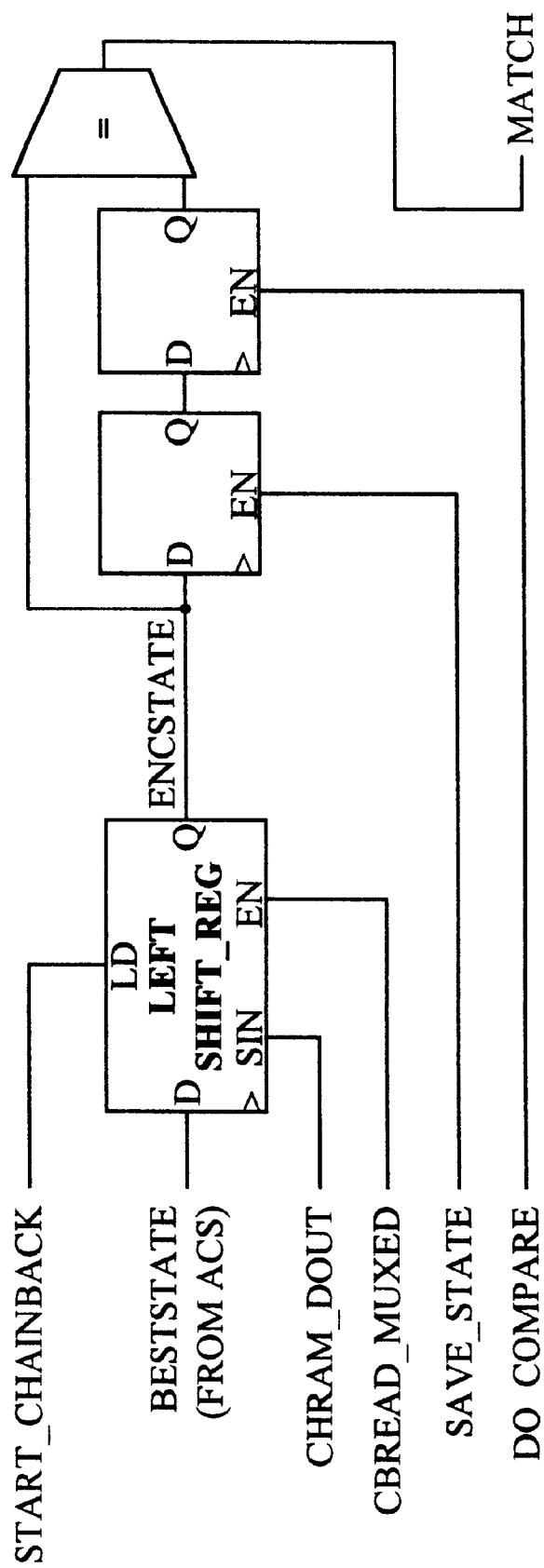
FIG. 7 illustrates in detail pertinent portions of a third embodiment of a chainback block of the mobile telephone of FIG. 4.

In the implementations thus far described, the chainback block circuitry operates in each process cycle to perform one chainback read before deciding whether to use the cache or not to complete the chainback operation. FIG. 7 illustrates an alternative implementation wherein m chainback reads are performed in each process cycle before deciding whether to use the cache or not to complete the chainback operation. More specifically, FIG. 7 illustrates the circuitry employed to generate the match signal based on m reads. The circuitry of FIG. 7 may be employed within the cached chainback blocks of either FIGS. 5A and 5B or FIGS. 6A and 6B as a substitute for the corresponding match signal-generating circuitry shown therein. The match circuitry of FIG. 7 operates in a process cycle to perform m chainback reads, then to compare the current value of encstate vs. encstate saved after m−1 reads during the previous process cycle. In this embodiment, the signal enable_cache_read is timed so it pulsed simultaneous with the m'th chainback read. Also instead of saving the value of beststate at the beginning of each chainback operation, the value of encstate is saved after m−1 reads. The particular choice of m involves a tradeoff between the number of reads (m) required each process cycle vs. the probability of a match. A larger value of m increases the chance of a match after m reads. It should be noted that the circuitry of FIG. 7 receives an additional signal save_state for use in latching encstate after m−1 reads. Also, signal do_compare differs slightly from the description above because it pulses after m reads instead of after a single read and is used to also latch in the value of encstate latched in during the previous read so it is available for comparison during the next process cycle.

In yet another even more general implementation, instead of checking the value of encstate after 1 or m reads, in each process cycle, encstate is compared after a through b reads, i.e. after a chainback reads, encstate is compared with the value of encstate saved during the previous process cycle after a−1 reads were performed, then after the next read (a+1), encstate is compared with the value of encstate saved during the previous process cycle after a reads were done, etc. until b reads are performed in this process cycle. With this implementation, the values of encstate over b−a+1 states are stored preferably using a shift register. Each successive value of encstate is simply a left shift of the previous value of encstate with a new LSB. The signal enable_cache_read asserts over a range of chainback reads, stopping after b reads or once a match was found. The choices of a and b allow tradeoffs in terms of complexity and power savings. The implementations of FIGS. 5A and 5B or FIGS. 6A and 6B correspond to the case wherein a=1 and b=1, wherein one read is performed, hence the circuitry quickly makes a decision whether a match occurs or not. The implementation described just above wherein m reads are performed corresponds to the case where a=m, b=m, where it takes m reads to make the comparison.

The particular choice of values for a and b for any given system are based upon the type of system, the statistics of when convergence is likely to occur (i.e. how many reads are typically needed to converge to the path read the previous process cycle), the hardware complexity, and the desired power requirements. To reduce hardware complexity, b−a should be small. To reduce power requirements, a should be small, and the value of b will depend on the statistics of the system. In general, the larger the value of b, the more likely that a match will be found.

In still other implementations, chainback operations are performed over multiple process cycles. In the previously described implementations, for clarity in describing the invention, it was assumed 1 chainback operation is performed each process cycle. However, each implementation can be modified to perform chainback operations over multiple process cycles. For example, in an implementation where a chainback operation occurs every 4 process cycles, and where the result of such an operation is to produce 4 decoded bits, enable_cache_read could be triggered to pulse only on the 4th chainback read. However there is no requirement that such a system necessarily be configured to have enable_cache_read pulse only on the 4th chainback read. Rather, even if the chainback operation occurred over 4 process cycles, the determination of when to compare encstate can still be governed by the values of a and b. In this regard, enable_cache_read could assert 4 times if a match was found resulting in 4 bits of decoded data being read from the cache. A slightly different implementation operates to process using 4 bit chunks (or any other appropriate chunk size). So that when a chainback back operation is performed, the system checks after 4 reads if a match occurs. If so, the system reads out the last 4 bits of the cache and outputs those, otherwise the system keeps chaining back and stores the last 4 reads from the chainback RAM.

Many of the implementations thus far described relate to traffic channel systems wherein packetized information is processed, i.e. a block of data is convolutionally encoded and trailing zeroes are added at the end to reset the encoder state between each packet. As a result, the system waits L+K process cycles, then starts chaining back and then, at the end, the system performs one final chainback operation producing L+K bits. Other implementations of the invention are appropriate for non-packetized traffic channels such as synch or paging channels defined under IS95. For non-packetized traffic channels, data is framed but the encoder state is not reset in between each frame. So the decoder performs a chainback operation every process cycle. It should be understood that principles of the invention may be exploited in almost any serial Viterbi decoder, regardless of the channel type of the overall system.

The exemplary embodiments have been primarily described with reference to diagrams illustrating apparatus elements. Depending upon the implementation, each apparatus element, or portions thereof, may be configured in hardware, software, firmware or combinations thereof. It should be appreciated that in some cases not all components necessary for a complete implementation of a practical system are illustrated or described in detail. Rather, in those cases only those components necessary for a thorough understanding of the invention have been illustrated and described. Finally, the preceding description of the preferred and exemplary embodiments is provided to enable any person skilled in the art to make or use the present invention. Various modifications to these embodiments will be readily apparent to those skilled in the art and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A serial Viterbi decoder comprising:
   a receiver configured to receive a convolutionally encoded stream of symbols;
   an add-compare-select circuit configured to generating a plurality of decision bits from the convolutionally encoded stream of symbols during each of a plurality of process cycles;
   a module, including:
      a memory configured to store said plurality of decision bits for each of said plurality of process cycles, wherein the add-compare-select circuit generates, during each new process cycle, a decision bit representative of a best state metric by beginning with a current starting best state metric and then performing a sequential chainback operation through the plurality of stored decision bits in a chainback memory in each of the plurality of process cycles; and
      a cache, connected to the memory, the cache being used to store a sequence of decision bits accessed during a previous chainback cycle and for outputting the decision bit that would otherwise have been generated,
      wherein the cache is further used for storing the best state metric for the previous process cycle, storing the sequence of decision bits accessed during the previous process cycle, and receiving the best state metric for the current process cycle, and wherein the module further comprises:
      a controller configured to compare a shifted version of the best state metric for the current process cycle to the best state metric of the previous process cycle and, if there is a match, for accessing the earliest decision bit from the cache.

2. The serial Viterbi decoder of claim 1 wherein the cache operates to perform a through b reads during each process cycle, wherein after a reads, the cache is checked for each subsequent read until b reads have been performed or until a match is obtained.

3. The serial Viterbi decoder of claim 2 wherein a is m and b is m, wherein m is the number of chainback reads in each process cycle before attempting to use the cache.

4. The serial Viterbi decoder of claim 2 wherein a is 1 and b is 1.

5. A serial Viterbi decoder comprising:
   a receiver configured to receive a convolutionally encoded stream of symbols;
   an add-compare-select circuit configured to generating a plurality of decision bits from the convolutionally encoded stream of symbols during each of a plurality of process cycles;
   a module, including:
      a memory configured to store said plurality of decision bits for each of said plurality of process cycles, wherein the add-compare-select circuit generates, during each new process cycle, a decision bit representative of a best state metric by beginning with a current starting best state metric and then performing a sequential chainback operation through the plurality of stored decision bits in a chainback memory in each of the plurality of process cycles; and
      a cache, connected to the memory, the cache being used to store a sequence of decision bits accessed during a previous chainback cycle and for outputting the decision bit that would otherwise have been generated,
      wherein the cache comprises:
         a left shift register for receiving the best state metric for the current process cycle; and
         an L+1 bit RAM for storing the sequence of decision bits accessed during the previous chainback operation, wherein L is the chainback length.

6. The serial Viterbi decoder of claim 5 wherein the left shift register is configured to latch the best state metric for the previous process cycle.

7. A serial Viterbi decoder comprising:
   a receiver configured to receive a convolutionally encoded stream of symbols;
   an add-compare-select circuit configured to generating a plurality of decision bits from the convolutionally encoded stream of symbols during each of a plurality of process cycles;
   a module, including:
      a memory configured to store said plurality of decision bits for each of said plurality of process cycles, wherein the add-compare-select circuit generates, during each new process cycle, a decision bit representative of a best state metric by beginning with a current starting best state metric and then performing a sequential chainback operation through the plurality of stored decision bits in a chainback memory in each of the plurality of process cycles; and a cache, connected to the memory, the cache being used to store a sequence of decision bits accessed during a previous chainback cycle and for outputting the decision bit that would otherwise have been generated, wherein the cache comprises:

a latch for storing the best state metric for the previous process cycle;

a left shifter register for receiving the best state metric for the current process cycle and for shifting in decision bits;

a comparator for comparing the best state metric for the previous process cycle to a shifted version of the best state metric of the current process cycle and, if there is a match, for outputting a match signal;

an L bit shift register for storing the sequence of decision bits accessed during the previous chainback operation, wherein L is the chainback length; and an output circuit, connected to the L bit shift register and to the comparator, for receiving the match signal from the comparator and for controlling the L bit shift register to output the earliest decision bit stored therein.

8. A serial Viterbi decoder comprising:

a receiver configured to receive a convolutionally encoded stream of symbols;

an add-compare-select circuit configured to generating a plurality of decision bits from the convolutionally encoded stream of symbols during each of a plurality of process cycles;

a module, including:

a memory configured to store said plurality of decision bits for each of said plurality of process cycles, wherein the add-compare-select circuit generates, during each new process cycle, a decision bit representative of a best state metric by beginning with a current starting best state metric and then performing a sequential chainback operation through the plurality of stored decision bits in a chainback memory in each of the plurality of process cycles; and a cache, connected to the memory, the cache being used to store a sequence of decision bits accessed during a previous chainback cycle and for outputting the decision bit that would otherwise have been generated, wherein the cache comprises:

a left shift register for shifting in the best state metric for the current process cycle;

a plurality of sequential registers for storing previously shifted versions of the best state metric;

a comparator for comparing an output of the left shift register to an output of a last one of the plurality of sequential registers and, if there is a match, for outputting a match signal;

an L+1 bit RAM for storing the sequence of decision bits accessed during the previous chainback operation, wherein L is the chainback length; and an output circuit, connected to the L+1 bit RAM and to the comparator, for receiving the match signal from the comparator and for controlling the L+1 bit RAM to output the earliest decision bit stored therein.

9. A method for performing serial Viterbi decoding comprising the steps of:

receiving a convolutionally encoded stream of symbols;

generating a plurality of decision bits from the convolutionally encoded stream of symbols during each of plurality of process cycles;

storing said plurality of decision bits in a memory for each of said plurality of process cycles;

determining, during each new process cycle, a decision bit representative of a best state metric by beginning with a current starting best state metric and then performing a sequential chainback operation through the plurality of stored decision bits in the memory in each of the plurality of process cycles; and storing a sequence of decision bits accessed during a previous chainback operation in a cache and outputting the decision bit that would otherwise have been generated by the sequential chainback operation if a shifted version of the best state metric for the new process cycle is the same as the best state metric of the last process cycle.

10. The method of claim 9 wherein the step of storing a sequence of decision bits accessed during a previous chainback operation in a cache and outputting the decision bit representative of the best state metric if the current best state metric for the new process cycle points to the starting metric of the last process cycle comprises the steps of:

storing the best state metric for the previous process cycle;

storing the sequence of decision bits accessed during the previous chainback operation;

shifting in the best state metric for the current process cycle; and comparing the best state metric for the previous process cycle to the shifted best state metric of the current process cycle and, if there is a match, for outputting the earliest decision bit stored during the previous chainback operation.

11. The method of claim 10 wherein the step of storing a sequence of decision bits accessed during a previous chainback operation in a cache and outputting the decision bit representative of the best state metric if the current best state metric for the new process cycle points to the starting metric of the last process cycle is controlled to perform a through b reads during each process cycle, wherein after a reads, the cache is checked for each subsequent read until b reads have been performed or until a match is obtained.

12. The method of claim 11 wherein a is m and b is m.

13. The serial Viterbi decoder of claim 11 wherein a is 1 and b is 1.

* * * * *